(12) United States Patent
Kim et al.

(10) Patent No.: US 8,809,863 B2
(45) Date of Patent: Aug. 19, 2014

(54) THIN-FILM TRANSISTOR ARRAY SUBSTRATE, ORGANIC LIGHT-EMITTING DISPLAY HAVING THE SAME, AND METHOD OF MANUFACTURING THE ORGANIC LIGHT-EMITTING DISPLAY

(75) Inventors: Dae-Woo Kim, Yongin (KR); Jong-Hyun Park, Yongin (KR); Yul-Kyu Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 152 days.

(21) Appl. No.: 13/312,629

(22) Filed: Dec. 6, 2011

(65) Prior Publication Data
US 2013/0032802 A1 Feb. 7, 2013

(30) Foreign Application Priority Data
Aug. 1, 2011 (KR) .................. 10-2011-0076575

(51) Int. Cl.
*H01L 29/72* (2006.01)

(52) U.S. Cl.
USPC .......... 257/59; 257/40; 257/72; 257/E33.053; 257/E33.062

(58) Field of Classification Search
USPC ............... 257/40, 59, 72, E33.053, E33.062
See application file for complete search history.

(56) References Cited

U.S. PATENT DOCUMENTS

2013/0313528 A1* 11/2013 So et al. ..................... 257/40

FOREIGN PATENT DOCUMENTS

| JP | 2005-310591 A | 11/2005 |
| KR | 10-2010-0088269 A | 8/2010 |
| KR | 10-2011-0094463 A | 8/2011 |

* cited by examiner

*Primary Examiner* — Edward Wojciechowicz
(74) *Attorney, Agent, or Firm* — Knobbe, Martens, Olson & Bear, LLP

(57) ABSTRACT

A thin-film transistor array substrate, an organic light-emitting display having the same, and a method of manufacturing the organic light-emitting display are disclosed. In one embodiment, the thin-film transistor array substrate includes a buffer layer formed on a substrate, a first insulating layer formed on the buffer layer, a pixel electrode formed on the first insulating layer using a transparent conductive material, an intermediate layer that covers an upper side and outer side-surfaces of the pixel electrode and includes a organic light-emitting layer, a gap formed by etching the first insulating layer and the buffer layer at a peripheral of the pixel electrode, and a facing electrode that is formed on an upper side and outer side-surfaces of the pixel electrode to cover the intermediate layer and the gap.

11 Claims, 8 Drawing Sheets

THIN-FILM TRANSISTOR ARRAY SUBSTRATE, ORGANIC LIGHT-EMITTING DISPLAY HAVING THE SAME, AND METHOD OF MANUFACTURING THE ORGANIC LIGHT-EMITTING DISPLAY

CROSS-REFERENCE TO RELATED PATENT APPLICATION

This application claims the benefit of Korean Patent Application No. 10-2011-0076575, filed on Aug. 1, 2011, in the Korean Intellectual Property Office, the disclosure of which is incorporated herein in its entirety by reference.

BACKGROUND

1. Field

The described technology generally relates to a thin-film transistor array substrate, an organic light-emitting display having the same, and a method of manufacturing the organic light-emitting display.

2. Description of the Related Technology

A flat panel display, such as an organic light emitting display and a liquid crystal display is formed on a substrate. A pattern is generally formed on the substrate and includes a fine wiring structure that connects a thin-film transistor TFT and a capacitor.

Generally, such a pattern is transferred onto the substrate by using a mask having a fine pattern.

SUMMARY

One inventive aspect is an organic light-emitting display that is manufactured by a simple process and has a high aperture ratio and high optical extraction efficiency, and a method of manufacturing the organic light-emitting display device.

Another aspect is a thin-film transistor array substrate including: a buffer layer formed on a substrate; a first insulating layer formed on the buffer layer; a pixel electrode formed on the first insulating layer using a transparent conductive material; an intermediate layer that covers an upper side and outer side-surfaces of the pixel electrode and includes a organic light-emitting layer; a gap formed by etching the first insulating layer and the buffer layer at a peripheral of the pixel electrode; and a facing electrode that is formed on an upper side and outer side-surfaces of the pixel electrode to cover the intermediate layer and the gap.

The facing electrode may be a reflection electrode that reflects light generated from the organic light-emitting layer.

The thin-film transistor array substrate may further include: a second insulating layer that has an opening that exposes the entire pixel electrode and is formed on the first insulating layer; and a third insulating layer that has an opening greater than the opening in the second insulating layer and is formed on the second insulating layer.

The third insulating layer may cover a portion of the pixel electrode that is connected to one of source and drain electrodes.

The buffer layer, the first insulating layer, and the second insulating layer may form the same etch surface, and the gap may be formed between the etch surface and the outer side-surfaces of the pixel electrode.

Another aspect is an organic light-emitting display including: a buffer layer formed on a substrate; a thin-film transistor that includes an active layer, a gate electrode, a source electrode, and a drain electrode formed on the buffer layer; an organic light-emitting device that includes a pixel electrode disposed on the same layer as the gate electrode, an intermediate layer that includes a light-emitting layer and covers on an upper side and outer side-surfaces of the pixel electrode, and a facing electrode that covers the intermediate layer and a first gap formed at peripherals of the pixel electrode and is formed on the upper side and the outer side-surfaces of the pixel electrode; a first insulating layer that is formed on the buffer layer and is disposed between the active layer and the gate electrode and on a lower side of the pixel electrode; a second insulating layer that is disposed between the first insulating layer and the source and drain electrodes and includes an opening that exposes the pixel electrode; and a third insulating layer that is formed on the second insulating layer and includes an opening greater than the opening in the second insulating layer to expose the pixel electrode.

The first gap may be formed at peripherals of the pixel electrode by etching the first insulating layer and the buffer layer when the opening in the second insulating layer is formed.

The buffer layer, the first insulating layer, and the second insulating layer may form the same etch surface, and the first gap may be formed between the etch surface and the outer side-surfaces of the pixel electrode.

The third insulating layer may cover a portion of the pixel electrode that is connected to one of the source and drain electrodes.

The facing electrode may be a reflection electrode that reflects light generated from the light-emitting display layer, and the facing may have a diaphragm shape or a concaved mirror shape.

The organic light-emitting display device may further include a capacitor that includes a lower electrode disposed as the same layer of the active layer and an upper electrode disposed as the same layer of the gate electrode.

The second insulating layer may include another opening through which the upper electrode is exposed, and a second gap may be formed between the opening and the outer side-surfaces of the upper electrode.

Another aspect is a method of manufacturing an organic light-emitting display, the method including: performing a first mask process for forming a buffer layer and a semiconductor layer on a substrate, and an active layer of a thin-film transistor and a lower electrode of a capacitor by patterning the semiconductor layer; performing a second mask process for forming a first insulating layer covering the active layer and the lower electrode on the substrate, sequentially stacking a transparent conductive material and a first metal on the first insulating layer, and forming a gate electrode, a first electrode pattern for forming a pixel electrode and a second electrode pattern for forming an upper electrode of the capacitor by patterning the transparent conductive material and the first metal; performing a third mask process for forming a second insulating layer on the substrate on which the gate electrode, the first electrode pattern, and the second electrode pattern, and forming a first gap at peripherals of the first electrode pattern while forming an opening that exposes source and drain regions of the active layer, the first electrode pattern, and the second electrode pattern by patterning the second insulating layer; performing a fourth mask process for forming a second metal on the substrate on which the second insulating layer is formed, source and drain electrodes that connect the source and drain regions by patterning the second metal, and removing the first metal on the pixel electrode and the upper electrode; and performing a fifth mask process for forming a third insulating layer on the resultant structure of the fourth mask process, and exposing the pixel electrode by forming an opening greater than the opening formed in the second insulating layer by patterning the third insulating layer.

The method may further include doping the source and drain regions of the active layer after performing the second mask process.

The performing of the third mask process may include forming the same etch surface by simultaneously etching the buffer layer, the first insulating layer, and the second insulating layer while forming the opening that exposes the first electrode pattern by patterning the second insulating layer, and forming the first gap between the etch surface and outer side-surfaces of the first electrode pattern.

The performing of the third mask process may include forming the same etch surface by simultaneously etching the first insulating layer and the second insulating layer while forming the opening that exposes the second electrode pattern by patterning the second insulating layer, and forming a second gap between the etch surface and outer side-surfaces of the second electrode pattern.

The fourth mask process may include a first etching process for etching the second metal and a second etching process for removing the first metal on the pixel electrode and the upper electrode.

The performing of the fourth mask process may include forming the second metal using the same metal used to form the first metal, and simultaneously etching the first and second metals.

The method may further include doping the lower electrode of the capacitor after performing the fourth mask process.

The performing of the fifth mask process may include covering a portion of the pixel electrode that is connected to one of the source and drain electrodes with the third insulating layer.

The method may further include forming an intermediate layer having a light-emitting layer to cover an upper side and outer side-surfaces of the pixel electrode; and forming a facing electrode on the upper side and the outer side-surfaces of the pixel electrode to cover the intermediate layer and the first gap formed at the peripherals of the pixel electrode after performing the fifth mask process.

The facing electrode may be a reflection electrode that reflects light generated from the light-emitting layer, and may have a diaphragm shape or a concaved mirror shape.

DETAILED DESCRIPTION

Figure 1:
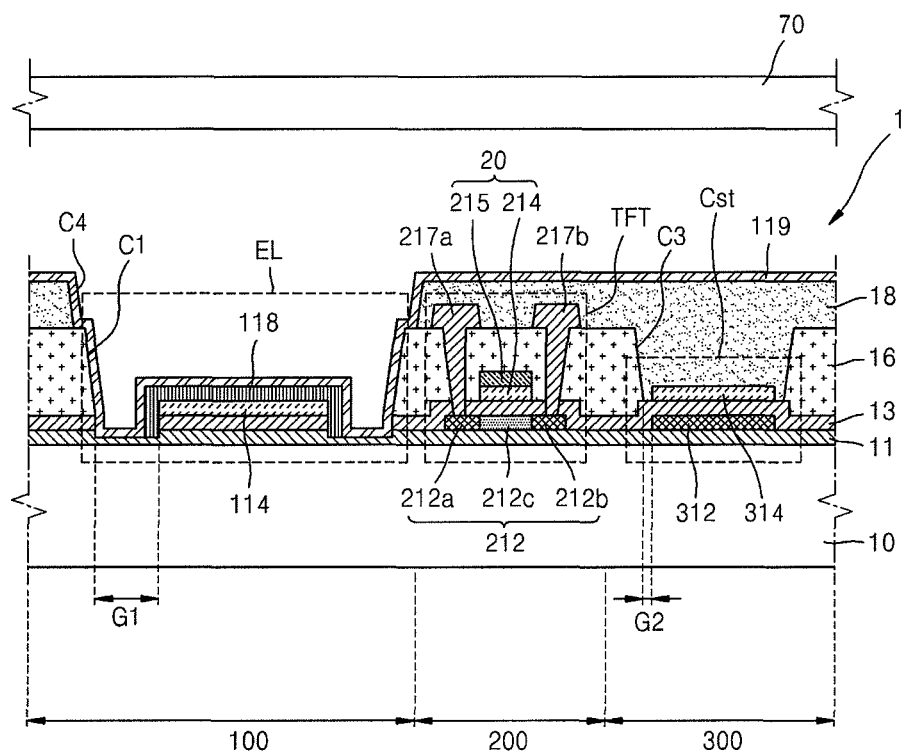
FIG. 1 is a schematic cross-sectional view of an organic light-emitting display device according to an embodiment.

A photo-lithography process is typically used for transferring a fine pattern onto a display substrate. The photolithography process uses a photoresist uniformly coated on a substrate on which a pattern is formed. The photoresist is exposed by using an exposing apparatus such as a stepper, and afterwards, (in the case of a positive photoresist) the exposed photoresist is developed. Also, after developing the photoresist, a series of processes is performed, for example, an etching of the photoresist by using the remaining photoresist as a mask and a removal of unnecessary photoresist.

In a process of transferring a pattern using a mask as described above, a required pattern is prepared in advance. Therefore, as the increase in the numbers of processes that use masks, cost for preparing the masks is increased. Also, the manufacturing process is complicated due to various time-consuming processes, resulting in cost increase.

Embodiments will be described more fully with reference to the accompanying drawings. In the drawings, like reference numerals denote like elements. In describing the embodiments, unnecessary or irrelevant descriptions will be omitted. Furthermore, the thicknesses of layers and regions may be exaggerated for clarity. It will be understood that when an element or layer is referred to as being "on" another element or layer, the element or layer may be directly on another element or layer or intervening elements or layers.

FIG. 1 is a schematic cross-sectional view of an organic light-emitting display device 1 according to an embodiment.

Referring to FIG. 1, the organic light-emitting display 1 includes a first substrate 10 which is a thin-film transistor array substrate that includes a thin-film transistor (TFT) and an organic light-emitting device and a second substrate 70 that is combined with the first substrate 10 via, for example, a sealing member.

The first substrate 10 may include the thin-film transistor TFT, the organic light-emitting device EL, and a capacitor Cst. Also, the first substrate 10 may be a crystalline substrate (LIPS), a glass substrate, or a plastic substrate.

The second substrate 70 may be a sealing substrate disposed on the first substrate 10 to prevent external moisture and air from penetrating into the thin-film transistor TFT and light-emitting pixels included on the first substrate 10. The second substrate 70 is disposed to face the first substrate 10, and the first and second substrates 10 and 70 are combined with each other by a sealing member disposed along edges of the two substrates 10 and 70. The second substrate 70 may be a glass substrate, a plastic substrate, or a stainless using steel (SUS) substrate.

A pixel region 100, a transistor region 200, and a capacitor region 300 are formed on the first substrate 10.

The pixel region 100 includes an organic light-emitting device EL. The organic light-emitting device EL includes a pixel electrode 114, a facing electrode 119 facing the pixel electrode 114, and an intermediate layer 118 interposed between the pixel electrode 114 and the facing electrode 119. The pixel electrode 114 may be formed on the first substrate 10, a buffer layer 11, and a first insulating layer 13 using a transparent conductive material, and is formed of the same layer as the first gate electrode 214 of the thin-film transistor TFT and an upper electrode 314 of the capacitor Cst using the same material used to form the first gate electrode 214 and the upper electrode 314.

The buffer layer 11 and the first insulating layer 13 disposed under the pixel electrode 114 may be formed by alternately stacking materials having refractive indexes different from each other to perform as a distributed brag reflector (DBR), and thus may increase optical efficiency of light emitted from the intermediate layer 118. The buffer layer 11 and the first insulating layer 13 may be formed at least partially of $SiO_2$ and $SiN_x$. In FIG. 1, the buffer layer 11 and the first insulating layer 13 respectively are formed as single layers. However, the buffer layer 11 and the first insulating layer 13 respectively may be formed as multiple layers.

The intermediate layer 118 is formed to cover an upper surface and outer side-surfaces of the pixel electrode 114 to insulate the pixel electrode 114 from the facing electrode 119, and thus, to prevent a short circuit between the facing electrode 119 and the pixel electrode 114. The intermediate layer 118 includes a light-emitting layer, and light generated from the light-emitting layer is emitted towards the first substrate 10 through the pixel electrode 114.

A second insulating layer 16 is formed on the first insulating layer 13 and outside the pixel electrode 114, and a first opening C1 that exposes the entire pixel electrode 114 in the second insulating layer 16. At this point, the buffer layer 11 and the first insulating layer 13 are etched together with the second insulating layer 16 so that the first opening C1 has a depth down to the buffer layer 11. Accordingly, the second insulating layer 16, the first insulating layer 13, and the buffer layer 11 may have the same etch-surface, and a predetermined first gap G1 may be formed between an etch-surface of the first opening C1 and the outer side-surfaces of the pixel electrode 114.

In one embodiment, a third insulating layer 18 is formed on the second insulating layer 16, and a fourth opening C4 that exposes the pixel electrode 114 and has a size greater than that of the first opening C1 may be formed in the third insulating layer 18 in a direction away from the pixel electrode 114. Here, a portion of the pixel electrode 114 that is connected to one of source/drain electrodes 217a/217b may be covered by the third insulating layer 18. Accordingly, a short circuit between the source/drain electrodes 217a/217b and the facing electrode 119 may be prevented.

In one embodiment, the facing electrode 119 is formed as a reflective electrode that includes a reflection material, and thus, light generated from a light-emitting layer of the intermediate layer 118 is reflected by the facing electrode 119 and is emitted towards the first substrate 10 passing through the pixel electrode 114. Also, the facing electrode 119 covers the intermediate layer 118 formed on an upper side and the outer side-surfaces of the pixel electrode 114 and the first gap G1 along the first opening C1 and the fourth opening C4. Thus, the facing electrode 119 formed in the first gap G1 at peripherals of the pixel electrode 114 reflects scattered light generated from a light-emitting layer of the intermediate layer 118 to be emitted towards the first substrate 10.

A thin-film transistor TFT is included in the transistor region 200. The thin-film transistor TFT includes an active layer 212, a gate electrode 20, and the source/drain electrodes 217a/217b. The gate electrode 20 includes a first gate electrode 214 and a second gate electrode 215, and the first gate electrode 214 may be formed of a transparent conductive material. The first insulating layer 13 which is a gate insulating film is interposed between the gate electrode 20 and the active layer 212 to insulate therebetween. Source and drain regions 212a and 212b highly doped with a dopant are formed on both edges of the active layer 212, and the source and drain regions 212a and 212b are respectively connected to the source and drain electrodes 217a and 217b.

A capacitor Cst is included in the capacitor region 300. The capacitor Cst includes a lower electrode 312 and an upper electrode 314, and the first insulating layer 13 is interposed therebetween. The lower electrode 312 may be formed of the same layer as the active layer 212 of the thin-film transistor TFT. The lower electrode 312 may be formed of a semiconductor material and is doped with a dopant to increase electrical conductivity thereof. The upper electrode 314 may be formed of the same layer as the first gate electrode 214 of the thin-film transistor TFT and the pixel electrode 114 of the organic light-emitting device EL using the same material used to form the first gate electrode 214 and the pixel electrode 114.

When the lower electrode 312 is formed of an intrinsic semiconductor that is not doped with a dopant, the lower electrode 312 constitutes a metal oxide semiconductor (MOS) capacitor structure together with the upper electrode 314 of the capacitor Cst. However, as in the current embodiment, when the lower electrode 312 is formed of a semiconductor doped with a dopant, the lower electrode 312 constitutes a metal-insulator-metal (MIM) capacitor structure having a capacitance greater than that of the MOS capacitor structure, thereby maximizing capacitance. Accordingly, since the MIM capacitor structure may realize a capacitance equal to the MOS capacitor structure with a smaller area, a margin of reducing the area of a capacitor is increased.

The second insulating layer 16 is formed on the first insulating layer 13 and outside the upper electrode 314, and a third opening C3 that exposes entire the upper electrode 314 and has an opening greater than the upper electrode 314. At this point, a predetermined second gap G2 may be formed between outer side-surfaces of the upper electrode 314 and the third opening C3. The region where the second gap G2 is formed is filled with the third insulating layer 18.

At this point, when the third insulating layer 18 is formed of an organic insulating material, a short circuit that may occur between the lower electrode 312 and the upper electrode 314 may be prevented by appropriately filling the second gap G2 with the organic insulating material. Also, a parasitic capacitance that may generate between the facing electrode 119 and the upper electrode 314 may be prevented by interposing an organic insulating material having a low dielectric constant between the facing electrode 119 and the upper electrode 314, and thus, signal interferences by the parasitic capacitance may be prevented.

In the current embodiment, the third opening C3 that exposes only the upper electrode 314 is formed. However, the third opening C3 may be formed by etching down to at least a portion of the first insulating layer 13 or the first insulating layer 13 and the buffer layer 11. Accordingly, at least portions of the second insulating layer 16 and the first insulating layer 13 or the second insulating layer 16, the first insulating layer 13, and the buffer layer 11 may not be disposed outside the lower electrode 312.

Figure 2:
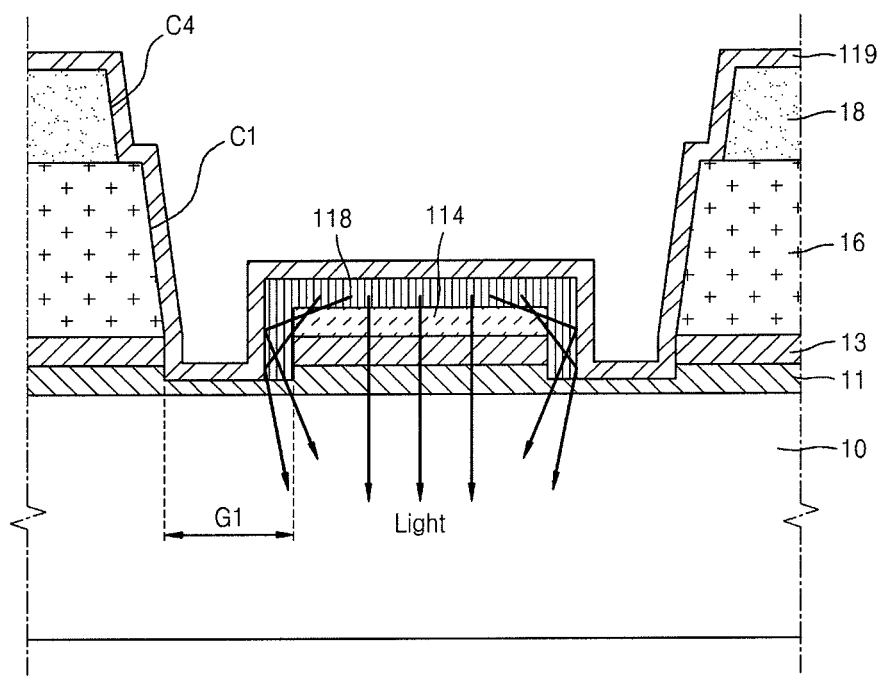
FIGS. 2 and 3 respectively are a schematic cross-sectional view and a plan view of a pixel region of an organic light-emitting display device according to an embodiment.
Figure 3:
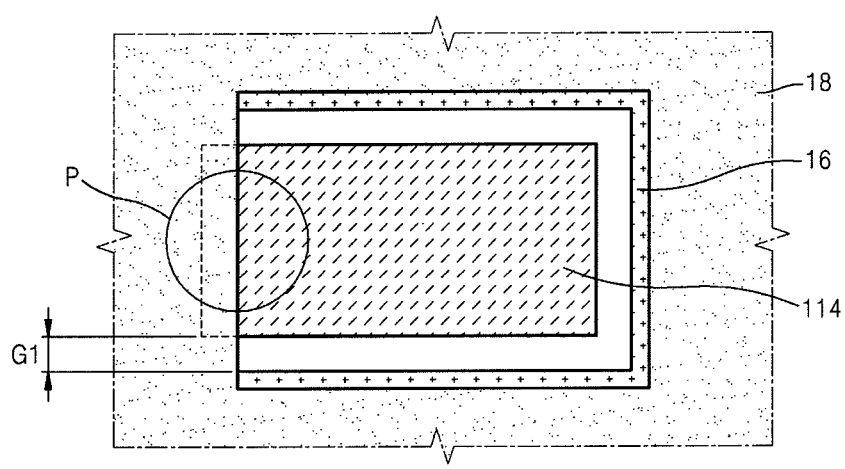
Figure 4:
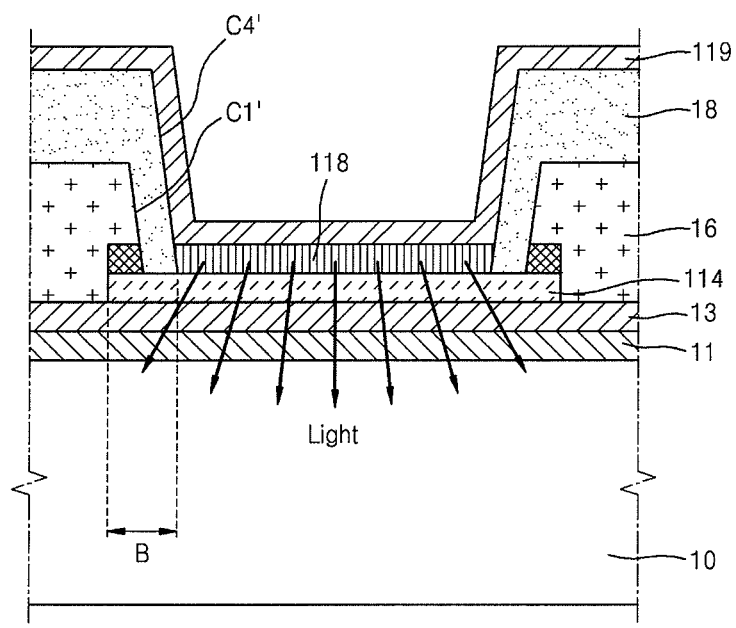
FIGS. 4 and 5 respectively are a schematic cross-sectional view and a plan view of a pixel region of an organic light-emitting display device according to a comparative example.
Figure 5:
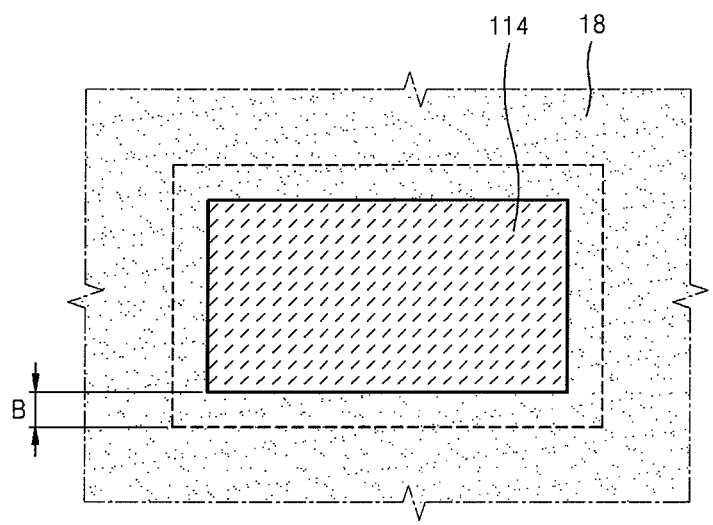

FIGS. 2 and 3 respectively are a schematic cross-sectional view and a plan view of a pixel region of an organic light-emitting display according to an embodiment. FIGS. 4 and 5 respectively are a schematic cross-sectional view and a plan view of a pixel region of an organic light-emitting display according to a comparative example. For convenience of explanation, the facing electrode 119 is not depicted in FIGS. 3 and 5.

Referring to FIGS. 2 and 3, in the current embodiment, the first gap G1 formed in the first insulating layer 13 and the buffer layer 11 is included at peripherals of the pixel electrode 114. The first gap G1 may be formed by etching the first insulating layer 13 and the buffer layer 11 together with the second insulating layer 16 when the first opening C1 that exposes the pixel electrode 114 is formed in the second insulating layer 16. In this case, the buffer layer 11, the first and second insulating layers 13 and 16 form the same etch-surface, and the first gap G1 is formed between the etch-surface and the outer side-surfaces of the pixel electrode 114.

As a pixel defining layer, the third insulating layer 18 having the fourth opening C4 which is greater than the first opening C1 is formed on the second insulating layer 16 to expose the pixel electrode 114 and the first gap G1. At this point, the third insulating layer 18 may prevent a short circuit between the source/drain electrodes 217a/217b and the facing electrode 119 by covering a portion P where the pixel electrode 114 is connected to one of the source/drain electrodes 217a/217b of the thin-film transistor TFT.

In the current embodiment, an opening of a pixel is expanded by exposing most part of the pixel electrode 114 by forming the pixel defining layer formed by the third insulating layer 18 outside of the pixel electrode 114. Accordingly, a light-emitting region is expanded, thereby increasing an aperture ratio.

The pixel region 100 includes the intermediate layer 118 that includes a light-emitting layer that covers the upper side and the outer side-surfaces of the pixel electrode 114. The facing electrode 119 covers the intermediate layer 118 and the first gap G1 along the first opening C1 and the fourth opening C4, and thus, has a diaphragm shape outside the pixel electrode 114. As a reflection electrode, the facing electrode 119 reflects scattered light generated from the light-emitting layer and allows the reflected light to be emitted towards the first substrate 10. That is, the facing electrode 119 formed in the first gap G1 at peripherals of the pixel electrode 114 may minimize a scattering path by reflecting the scattered light by performing as a metal mirror.

Referring to FIGS. 4 and 5, in the comparative example, openings C1' and C4' that expose a central portion of the pixel electrode 114 are formed in the second insulating layer 16 and the third insulating layer 18, and thus, the second insulating layer 16 and the third insulating layer 18 remain on an upper part B of the pixel electrode 114. Accordingly, the pixel electrode 114 in the comparative example has a reduced aperture ratio as much as the upper part B of the pixel electrode 114 when compared to the pixel electrode 114 in the pixel region of the organic light-emitting display 1 according the current embodiment as depicted in FIGS. 2 and 3.

Also, light scattered after being generated from the light-emitting layer of the intermediate layer 118 is not controlled in the comparative example, and is refracted and scattered while passing through the pixel electrode 114, the first insulating layer 13, and the buffer 11, thereby reducing optical efficiency.

Hereinafter, a method of manufacturing the organic light-emitting display 1 according to an embodiment will now be described with reference to FIGS. 6 through 13.

Figure 6:
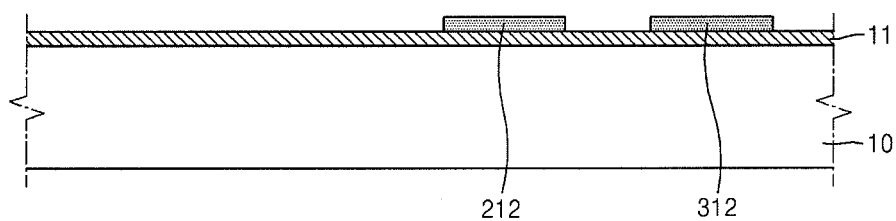
FIG. 6 is a schematic cross-sectional view of a first mask process of an organic light-emitting display device according to an embodiment.

FIG. 6 is a schematic cross-sectional view of a first mask process of the organic light-emitting display 1 according to an embodiment.

Referring to FIG. 6, the active layer 212 of the thin-film transistor TFT and the lower electrode 312 of the capacitor Cst are formed on the first substrate 10 on which the buffer layer 11 is stacked.

The first substrate 10 may be formed of a transparent glass material having $SiO_2$ as a main component. The material for forming the first substrate 10 is not limited thereto, that is, the first substrate 10 may be formed of various materials such as a transparent plastic material or a metal.

The buffer layer 11 such as a barrier layer or a blocking layer for preventing diffusion of impurity ions and penetration of moisture and air and for planarizing a surface of the first substrate 10 may be formed on an upper surface of the first substrate 10. The buffer layer 11 may be formed by various deposition methods such as a plasma enhanced chemical vapor deposition (PECVD) method, an atmospheric pressure CVD (APCVD) method, or a low pressure CVD (LPCVD) method using $SiO_2$ and/or $SiN_x$.

The active layer 212 of the thin-film transistor TFT and the lower electrode 312 of the capacitor Cst are formed on the buffer layer 11. Although not shown, after depositing a semiconductor layer (not shown) on the buffer layer 11, and afterwards, coating a photoresist (not shown) on the semiconductor layer (not shown), the active layer 212 of the thin-film transistor TFT and the lower electrode 312 of the capacitor Cst may be substantially simultaneously formed by patterning the semiconductor layer (not shown) using a photolithography process with a first mask (not shown).

The first mask process by a photolithography includes a series of processes such as developing, etching, stripping, or ashing after exposing the first mask (not shown) using an exposing apparatus (not shown).

The semiconductor layer (not shown) may be formed of amorphous silicon or polysilicon. The polysilicon may be formed by crystallizing amorphous silicon. Amorphous silicon may be crystallized by various crystallization methods, for example, a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method.

In the current embodiment, the active layer 212 of the thin-film transistor TFT and the lower electrode 312 of the capacitor Cst are separated from each other. However, the active layer 212 of the thin-film transistor TFT and the lower electrode 312 of the capacitor Cst may be formed as one body.

Figure 7:
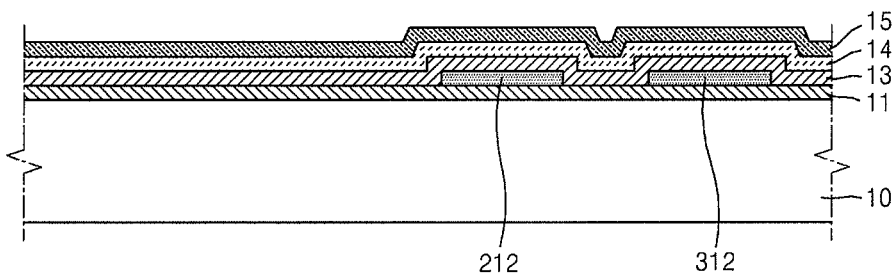
FIGS. 7 and 8 are schematic cross-sectional views of a second mask process of an organic light-emitting display device according to an embodiment.
Figure 8:
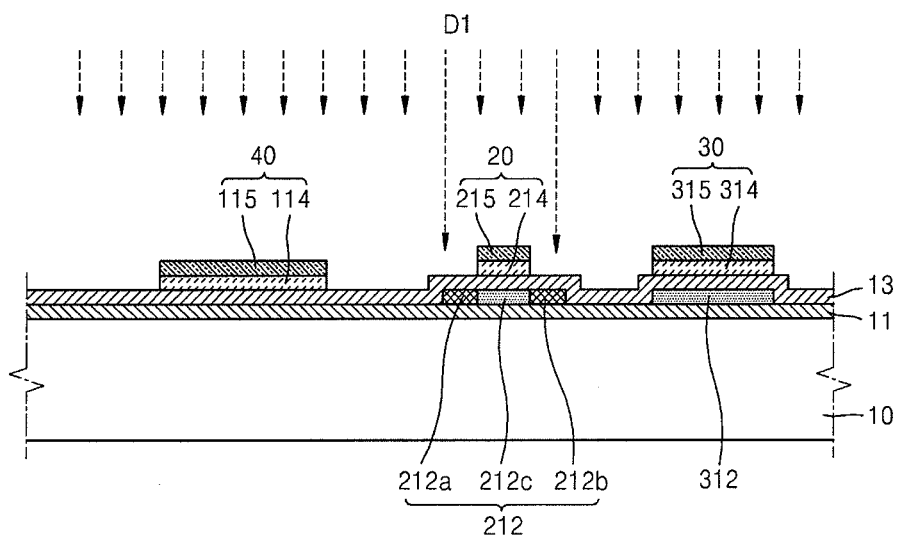

FIGS. 7 and 8 are schematic cross-sectional views of a second mask process of the organic light-emitting display 1 according to an embodiment.

Referring to FIG. 7, the first insulating layer 13 is stacked on an entire surface of the first substrate 10 on which the active layer 212 of the thin-film transistor TFT and the lower electrode 312 of the capacitor Cst are formed, and a first conductive layer 14 and a second conductive layer 15 are sequentially stacked on the first insulating layer 13.

The first insulating layer 13 may be deposited by a PECVD method, an APCVD method, or a LPCVD method using an inorganic insulating material such as $SiO_2$ and/or $SiN_x$. The first insulating layer 13 functions as a gate insulating film of the thin-film transistor TFT by disposing between the active layer 212 and the gate electrode 20 of the thin-film transistor TFT, and functions as a dielectric layer of the capacitor Cst by disposing between the upper electrode 314 and the lower electrode 312 of the capacitor Cst.

The first conductive layer 14 is a transparent conductive layer, and may include at least one material selected from the group consisting of indium tin oxide (ITO), indium zinc oxide (IZO), zinc oxide (ZnO), indium oxide (In$_2$O$_3$), indium gallium oxide (IGO), and aluminum zinc oxide (AZO).

The second conductive layer 15 may be formed as a single layer or a multiple layer using at least one metal selected from the group consisting of aluminum Al, platinum Pt, palladium Pd, silver Ag, magnesium Mg, gold Au, nickel Ni, neodymium Nd, iridium Ir, chrome Cr, lithium Li, calcium Ca, molybdenum Mo, titanium Ti, tungsten W, and copper Cu.

Referring to FIG. 8, the first conductive layer 14 and the second conductive layer 15 are substantially simultaneously patterned by a second mask process that uses a second mask (not shown). As a result of patterning, the gate electrode 20, a first electrode pattern 40, and a second electrode pattern 30 are respectively formed on the first insulating layer 13.

In the transistor region 200, the gate electrode 20 is formed on the active layer 212. The gate electrode 20 includes the first gate electrode 214 formed as a part of the first conductive layer 14 and the second gate electrode 215 formed as a part of the second conductive layer 15.

In the pixel region 100, the first electrode pattern 40 is formed on the first insulating layer 13. The first electrode pattern 40 includes the pixel electrode 114 formed as a part of the first conductive layer 14 and a metal layer 115 formed as a part of the second conductive layer 15.

In the capacitor region 300, the second electrode pattern 30 is formed on the first insulating layer 13. The second electrode pattern 30 includes the upper electrode 314 formed as a part of the first conductive layer 14 and a metal layer 315 formed as a part of the second conductive layer 15.

Next, an ion dopant is doped D1 on the entire surface of the first substrate 10 on which the gate electrode 20, the first electrode pattern 40, and the second electrode pattern 30 are formed. A p-type semiconductor may be obtained when the surface of the first substrate 10 is doped with a III-Group element such as boron, and an n-type semiconductor may be obtained when the surface of the first substrate 10 is doped with a V-Group element such as nitrogen. The doping may be performed on the entire surface of the first substrate 10. At this point, the doping D1 is performed at a concentration of greater than $1\times10^{15}$ atoms/cm2 to the active layer 212 of the thin-film transistor TFT as a target.

Here, the gate electrode 20 is formed to correspond to a central portion of the active layer 212. When the active layer 212 is doped with a dopant by using the gate electrode 20 as a self-aligning mask, the active layer 212 may include the source and drain regions 212a and 212b to which an ion dopant is doped and a channel region 212c interposed between the source and drain regions 212a and 212b. That is, the source and drain regions 212a and 212b may be formed by using the gate electrode 20 as a self-aligning mask without using an additional mask. The lower electrode 312 formed of the same material used to form the active layer 212 is not doped as well as the channel region 212c since the second electrode pattern 30 functions as a blocking mask.

Figure 9:
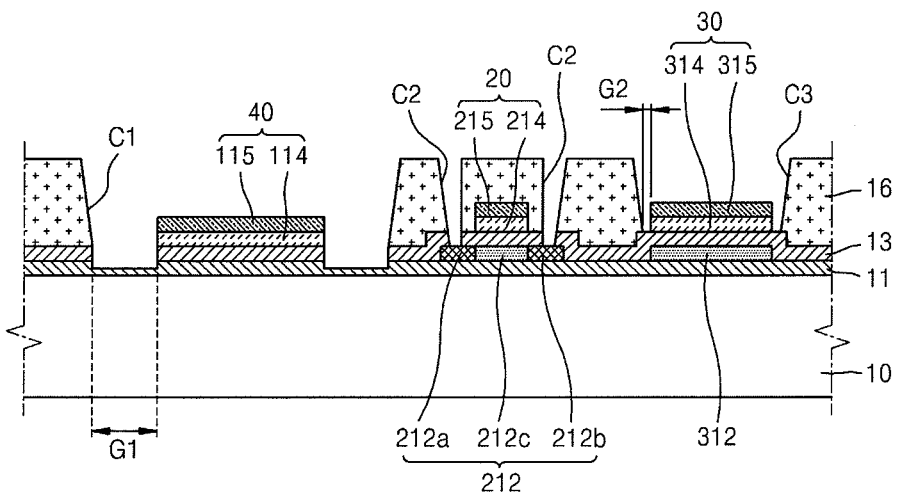
FIG. 9 is a schematic cross-sectional view of a third mask process of an organic light-emitting display device according to an embodiment.

FIG. 9 is a schematic cross-sectional view of a third mask process of the organic light-emitting display 1 according to an embodiment.

Referring to FIG. 9, the second insulating layer 16 is stacked on the resultant structure of the second mask process as shown in FIG. 8. The first opening C1 that exposes the entire first electrode pattern 40, the second opening C2 that exposes portions of the source and drain regions 212a and 212b of the active layer 212, and the third opening C3 that exposes the entire second electrode pattern 30 are formed by patterning the second insulating layer 16 and the insulating layers under the second insulating layer 16.

The second insulating layer 16 may be formed by a method such as a spin coating method using at least one material selected from the group consisting of polyimide, polyamide, acryl resin, benzocyclobutene, and phenol resin. The second insulating layer 16 may be formed to have a thickness sufficient enough, for example, greater than that of the first insulating layer 13 described above, to perform as an interlayer insulating layer between the gate electrode 20 of the thin-film transistor TFT and the source and drain electrodes 217a and 217b. The second insulating layer 16 may also be formed of an inorganic insulating material used to form the first insulating layer 13 in addition to the organic insulating materials described above. Also, the second insulating layer 16 may be formed by alternately depositing an organic insulating material and an inorganic insulating material.

The first opening C1 is formed by etching the second insulating layer 16, the first insulating layer 13, and the buffer layer 11 to expose the first electrode pattern 40. The first and second insulating layers 13 and 16 and the buffer layer 11 may be substantially simultaneously etched, and thus, may form substantially the same etch surface.

Accordingly, the first gap G1 may be formed between outer side-surfaces of the first electrode pattern 40 and the etch surface of the first opening C1. In FIG. 9, a portion of the buffer layer 11 is etched; however, the entire buffer layer 11 may be etched. Also, in FIG. 9, the first gap G1 is formed in the second insulating layer 16, the first insulating layer 13, and the buffer layer 11; however, the first gap G1 may not be formed in the buffer layer 11 but may be formed only in the second insulating layer 16 and the first insulating layer 13.

The second opening C2 exposes portions of the source and drain regions 212a and 212b. At this point, the second insulating layer 16 and the first insulating layer 13 are simultaneously etched.

The third opening C3 is formed by etching the second insulating layer 16 to expose the entire second electrode pattern 30. Accordingly, the second gap G2 may be formed between outer side-surfaces of the second electrode pattern 30 and the third opening C3. In FIG. 9, the second gap G2 is formed in the second insulating layer 16; however, the second gap G2 may be formed in the first insulating layer 13 under the second insulating layer 16 or may be formed in the first insulating layer 13 and the buffer layer 11.

Figure 10:
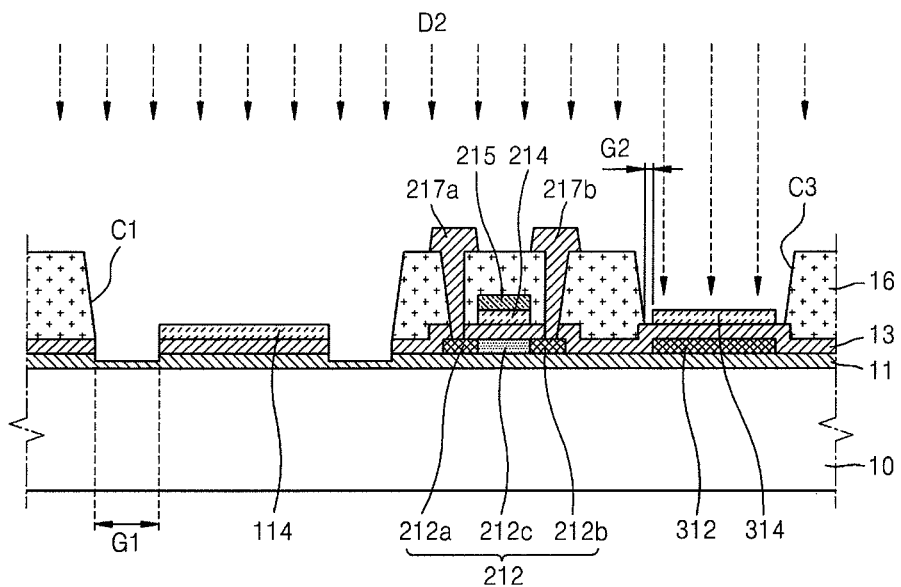
FIG. 10 is a schematic cross-sectional view of a fourth mask process of an organic light-emitting display device according to an embodiment.

FIG. 10 is a schematic cross-sectional view of a fourth mask process of the organic light-emitting display 1 according to an embodiment.

Referring to FIG. 10, the source and drain electrodes 217a and 217b are formed on the second insulating layer 16. The source and drain electrodes 217a and 217b may be formed as a single layer or a multiple layer using at least one metal selected from the group consisting of Al, Pt, Pd, Ag, Mg, Au, Ni, Nd, Ir, Cr, Li, Ca, Mo, Ti, W, and Cu.

Although not shown in detail in FIG. 10, the source and drain electrodes 217a and 217b are formed by the following process. First, after depositing a metal for forming the source and drain electrodes 217a and 217b on the resultant structure of the third mask process as shown in FIG. 9, the metal is patterned only to remain a pattern of the source and drain electrodes 217a and 217b using a fourth mask (not shown).

At this point, when the metal for forming the source and drain electrodes 217a and 217b, the metal for forming an upper metal layer 115 of the first electrode pattern 40, and the metal for forming an upper metal layer 315 of the second electrode pattern 30 are the same material, the upper metal layer 115 of the first electrode pattern 40 and the upper metal layer 315 of the second electrode pattern 30 may be removed while patterning the source and drain electrodes 217a and 217b by a single etching process using the same etchant.

When the upper metal layer 115 of the first electrode pattern 40 and the upper metal layer 315 of the second electrode pattern 30 are formed of materials different from each other, the pattern of the source and drain electrodes 217a and 217b is formed by etching the metal for forming the electrodes 217a and 217b using a first etchant, and then, the upper metal layer 115 of the first electrode pattern 40 and the upper metal layer 315 of the second electrode pattern 30 may be removed by using a second etchant.

Accordingly, the pixel electrode 114 is formed in the pixel region 100, and the upper electrode 314 is formed in the capacitor region.

Next, an ion dopant is doped on the resultant structure formed by the fourth mask process and the etching process. The doping D2 is performed onto the lower electrode 312 of the capacitor Cst as a target to an appropriate concentration by injecting an n-type dopant or a p-type dopant. The dopant to be injected may be the same as or different from the dopant used to dope the active layer 212 of the thin-film transistor TFT.

Due to the doping of the lower electrode 312 of the capacitor Cst, the conductivity of the lower electrode 312 of the capacitor Cst is increased, and accordingly, the lower electrode 312 of the capacitor Cst, the first insulating layer 13, and the upper electrode 314 form a MIM capacitor structure, thereby increasing the capacitance of the capacitor Cst.

Also, since the third opening C3 greater than the upper electrode 314 is formed in the second insulating layer 16 and the second conductive layer 15 of the second electrode pattern 30 is substantially completely removed without remaining any portion thereof, the lower electrode 312 of the capacitor Cst may be substantially completely doped. Therefore, the increase in aperture ratio, capacitance, and signal transmission quality of wirings of the capacitor of the organic light-emitting display 1 may be realized. Here, the doping of the dopant is performed with respect to the lower electrode 312 of the capacitor Cst as a target. However, the doping may be performed on the entire surface of the first substrate 10.

Figure 11:
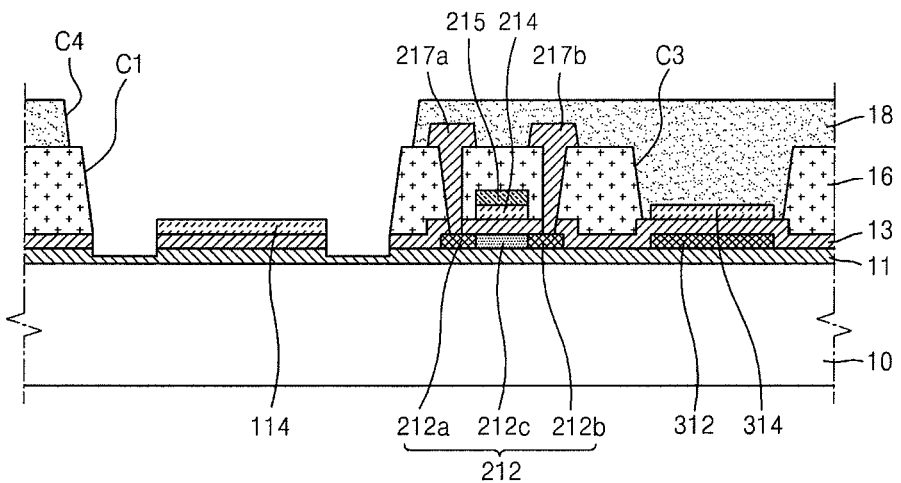
FIG. 11 is a schematic cross-sectional view of a fifth mask process of an organic light-emitting display device according to an embodiment.

FIG. 11 is a schematic cross-sectional view of a fifth mask process of the organic light-emitting display 1 according to an embodiment.

Referring to FIG. 11, the third insulating layer 18 is stacked on the resultant structure of the fourth mask process as depicted in FIG. 10, and the fourth opening C4 that exposes the pixel electrode 114 is formed by patterning the third insulating layer 18. The third insulating layer 18 functions as a pixel defining layer in the light-emitting region defined by the fourth opening C4. At this point, the third insulating layer 18 may cover a portion of the pixel electrode 114 where the pixel electrode 114 is connected to one of the source and drain electrodes 217a and 217b.

The fourth opening C4 may be formed greater than the first opening C1 formed in the second insulating layer 16, and thus, the third insulating layer 18 does not cover the pixel electrode 114. Therefore, the light-emitting region is expanded, thereby increasing the aperture ratio of the pixel region 100.

Figure 12:
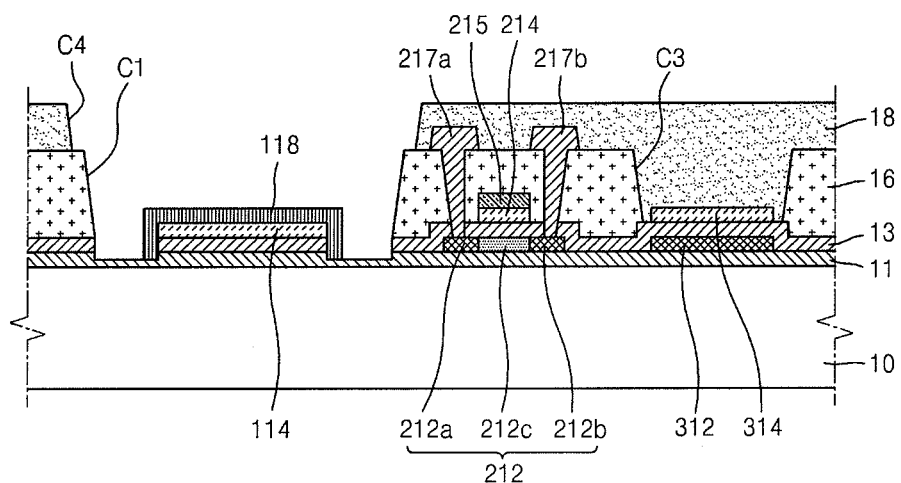
FIGS. 12 and 13 are schematic cross-sectional views of a process after the fifth mask process of an organic light-emitting display device according to an embodiment.
Figure 13:
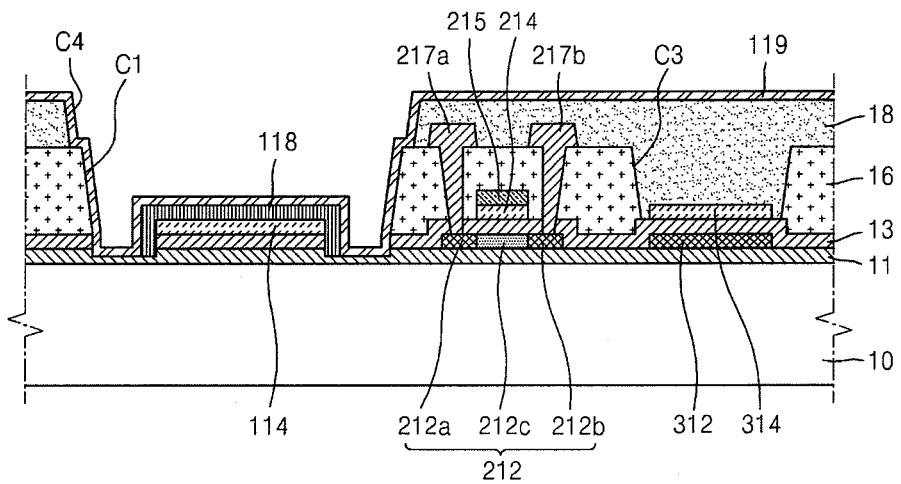

FIGS. 12 and 13 are schematic cross-sectional views of a process after the fifth mask process of the organic light-emitting display 1 according to an embodiment.

Referring to FIG. 12, the intermediate layer 118 that includes a light-emitting layer is formed on and outer side-surfaces of the pixel electrode 114.

The intermediate layer 118 is formed to cover the upper side and the outer side-surfaces of the pixel electrode 114 to insulate the facing electrode 119 and the pixel electrode 114 from each other, and thus, a short circuit between the pixel electrode 114 and the facing electrode 119 may be prevented.

The intermediate layer 118 may be formed as a single layer or a composite layer by stacking an organic emissive layer (EML) and at least one of functional layer selected from the group consisting of a hole transport layer (HTL), a hole injection layer (HIL), an electron transport layer (ETL), and an electron injection layer (EIL).

The intermediate layer 118 may be formed of a low molecular weight organic material or a polymer organic material.

When the intermediate layer 118 is formed of a low molecular weight organic material, in the intermediate layer 118, the HTL, the HIL, the ETL, and the EIL may be stacked from an organic light-emitting layer. Besides above, various layers may be stacked if necessary. At this point, the intermediate layer 118 may be formed of various low molecular weight organic materials including copper phthalocyanine (CuPc), N,N'-Di(naphthalene-1-yl)-N,N'-diphenyl-benzidine (NPB), or tris-8-hydroxyquinoline aluminum)(Alq3).

When the intermediate layer 118 is formed of a polymer organic material, the intermediate layer 118 may include the HTL besides the organic light-emitting layer. The HTL may be formed of poly-(2,4)-ethylene-dihydroxy thiophene (PEDOT) or polyaniline (PANI). At this point, the intermediate layer 118 may be formed of a polymer organic material such as a poly-phenylenevinylene (PPV) group polymer and a polyfluorene group polymer.

Referring to FIG. 13, the facing electrode 119 is deposited on the intermediate layer 118. The facing electrode 119 may function as a common electrode by being deposited on the entire surface of the first substrate 10. In the case of the organic light-emitting display 1 according to the current embodiment, the pixel electrode 114 is used as an anode electrode and the facing electrode 119 is used as a cathode electrode. The polarities of the pixel electrode 114 and the facing electrode 119 may be reversed.

The facing electrode 119 may be a reflection electrode having a reflection material. The facing electrode 119 may be deposited to be thin using a metal selectd from the group consisting of Ag, Mg, Al, Pt, Pd, Au, Ni, Nd, Ir, Cr, Li, Ca, LiF/Ca, LiF/Al, Mg/Ag or a compound of these metals.

The facing electrode 119 covers the pixel electrode 114, the intermediate layer 118, and the first gap G1 in the pixel region 100 along the first opening C1 and the fourth opening C4. Accordingly, the facing electrode 119 has a diaphragm structure protruded towards the first substrate 10 at peripherals of the pixel electrode 114. The diaphragm structure of the facing electrode 119 performs as a metal mirror in the first gap G1, and thus, increases optical efficiency by reflecting light scattered at by the intermediate layer 118.

Figure 14:
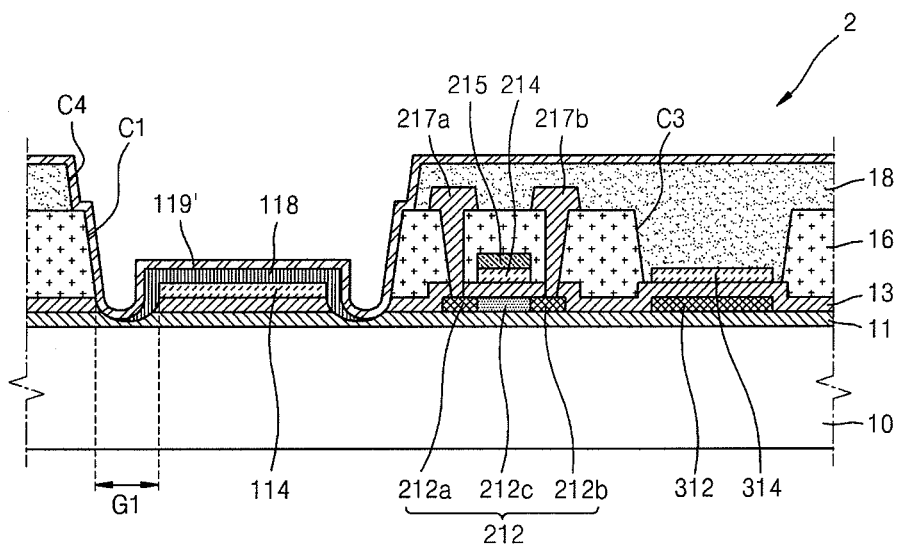
FIG. 14 is a schematic cross-sectional view of an organic light-emitting display device according to another embodiment.
Figure 15:
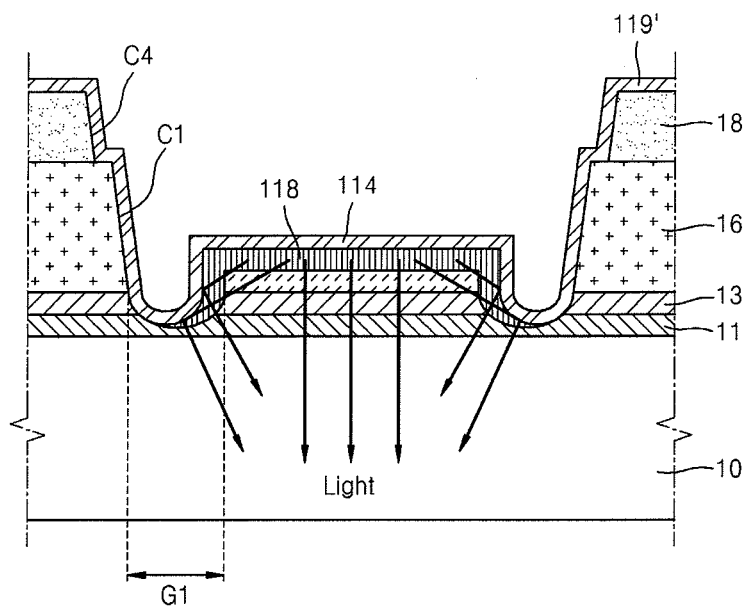
FIG. 15 is a schematic cross-sectional view of a pixel region of an organic light-emitting display device of FIG. 14 according to an embodiment.

FIG. 14 is a schematic cross-sectional view of an organic light-emitting display 2 according to another embodiment. FIG. 15 is a schematic cross-sectional view of a pixel region of the organic light-emitting display 2.

Referring to FIGS. 14 and 15, the organic light-emitting display 2 has a structure similar to the organic light-emitting display 1 of FIG. 1 except the difference of the shape of the first gap G1 in the pixel region of the organic light-emitting display 1, and thus, the descriptions thereof will not be repeated. The first substrate 10 of the organic light-emitting display 2 may include a thin-film transistor TFT, an organic light-emitting device EL, and a capacitor Cst.

A pixel region 100 includes the organic light-emitting device EL that includes a pixel electrode 114, a facing electrode 119' formed to face the pixel electrode 114, and an intermediate layer 118 interposed between the pixel electrode 114 and the facing electrode 119'. The pixel electrode 114 is formed on a first substrate 10, a buffer layer 11, and a first insulating layer 13 using a transparent conductive material, and may be formed of the same layer as a first gate electrode 214 of the thin-film transistor TFT and an upper electrode 314 of the capacitor Cst using the same material used to form the first gate electrode 214 and the upper electrode 314.

The intermediate layer 118 is formed to cover an upper side and outer side-surfaces of the pixel electrode 114 to insulate the facing electrode 119' from the pixel electrode 114, and thus, a short circuit between the pixel electrode 114 and the facing electrode 119' may be prevented. The intermediate layer 118 includes an organic light-emitting layer, and light generated from the organic light-emitting layer is emitted through the pixel electrode 114 towards the first substrate 10.

A second insulating layer 16 is formed on the first insulating layer 13 and outside the pixel electrode 114, and a first opening C1 that exposes the entire pixel electrode 114 is formed in the second insulating layer 16. At this point, the first opening C1 may have a depth down to the buffer layer 11 by etching the first insulating layer 13 and the a buffer layer 11 together with the second insulating layer 16. Accordingly, the second insulating layer 16, the first insulating layer 13, and the buffer layer 11 form the same etch surface, and a predetermined first gap G1 may be formed between the outer side-surfaces of the pixel electrode 114 and the etch surface of the first opening C1.

Here, when the second insulating layer 16 is etched to form the first gap G1, the gap G1 having a concave shape may formed through performing an under-cut by over-etching the first insulating layer 13 and the buffer layer 11 disposed under the second insulating layer 16 according to the use of an etchant and an etching method.

In one embodiment, a third insulating layer 18 is formed on the second insulating layer 16, and a fourth opening C4 that exposes the second insulating layer 16 and the pixel electrode 114 and has a size greater than that of the first opening C1 may be formed in the third insulating layer 18 in a direction away from the pixel electrode 114. Here, the third insulating layer 18 may be formed to cover a portion of the pixel electrode 114 where the pixel electrode 114 is connected to one of the source and drain electrodes 217a and 217b. Accordingly, a short circuit between the source and drain electrodes 217a and 217b and the facing electrode 119' may be prevented.

The intermediate layer 118 is formed to cover an upper side and outer side-surfaces of the pixel electrode 114 to insulate the facing electrode 119' from the pixel electrode 114, and thus, a short circuit between the pixel electrode 114 and the facing electrode 119' may be prevented.

The facing electrode 119 is formed as a reflective electrode that includes a reflection material, and thus, light generated from a light-emitting layer of the intermediate layer 118 is reflected by the facing electrode 119' and is emitted towards the first substrate 10 passing through the pixel electrode 114. Also, the facing electrode 119' covers the intermediate layer 118 formed on the upper side and the outer side-surfaces of the pixel electrode 114 and the first gap G1 along the first opening C1 and the fourth opening C4. Thus, the facing electrode 119' formed in the first gap G1 at peripherals of the pixel electrode 114 reflects scattered light generated from a light-emitting layer of the intermediate layer 118 to be emitted towards the first substrate 10.

The facing electrode 119' covers the intermediate layer 118 and the first gap G1 along the first opening C1 and the fourth opening C4 in the pixel region, and thus, the facing electrode 119' has a concaved mirror shape protruded towards the first substrate 10 at outer side-surfaces of the pixel electrode 114. Accordingly, the facing electrode 119' reflects light scattered from the organic light-emitting layer of the intermediate layer 118 by performing as a metal mirror in the first gap G1 and focuses light in the center of the organic light-emitting display 2, thereby increasing optical efficiency.

In one embodiment, when an opening is formed in the second insulating layer 16 and the third insulating layer 18 in the third mask process, the facing electrodes 119 and 119' may be formed to have a diaphragm shape or a concaved mirror shape in the first gap G1 by forming the first opening C1 and the fourth opening C4 to expose entire pixel electrode 114 and the facing electrodes 119 and 119' along the first opening C1 and the fourth opening C4. Thus, an aperture ratio and optical efficiency of the organic light-emitting displays may be increased.

In the above embodiments, the first opening C1 and the third opening C3 respectively are formed to expose the entire pixel electrode 114 and the entire upper electrode 314 of the capacitor Cst. However, only the first opening C1 may be formed to the structure described above.

When mask processes are performed for forming the organic light-emitting displays 1 and 2, the removal of the stacked layer may be performed by dry etching or wet etching.

In the above embodiments, the organic light-emitting displays 1 and 2 are described as examples. However, the above embodiments may be applied to various display devices including liquid crystal displays.

Also, in at least one of the disclosed embodiments, a single TFT and a single capacitor are depicted in the drawings for convenience of explanation. However, a plurality of TFTs and a plurality of capacitors may be included as long as the numbers of the mask processes are not increased.

According to at least one of the disclosed embodiments, the manufacturing process of the organic light-emitting display is simplified. Also, as the area of a light-emitting region increases, the aperture ratio also increases. Furthermore, the facing electrode at peripherals of the pixel electrode is formed as a diaphragm shape or a concaved mirror shape. Accordingly, light scattering is minimized and optical extraction efficiency of the display increases. Therefore, a clear panel may be provided.

While the disclosed embodiments have been described with respect to the accompanying drawings, it will be understood by those of ordinary skill in the art that various changes in form and details may be made therein without departing from the spirit and scope of the following claims.

What is claimed is:

1. A thin-film transistor array substrate comprising:
a buffer layer formed on a substrate;
a first insulating layer formed on the buffer layer;
a pixel electrode formed on the first insulating layer, wherein the pixel electrode is formed at least partially of a transparent conductive material;
an intermediate layer that covers an upper side and outer side-surfaces of the pixel electrode and comprises an organic light-emitting layer;
a gap formed at a peripheral of the pixel electrode, wherein the gap is formed between an etch surface of the buffer layer and the outer side-surfaces of the pixel electrode; and a facing electrode covering the intermediate layer and formed in the gap.

2. The thin-film transistor array substrate of claim 1, wherein the facing electrode is a reflective electrode configured to reflect light generated from the organic light-emitting layer.

3. The thin-film transistor array substrate of claim 1, wherein a portion of the facing electrode formed outside the pixel electrode has a diaphragm shape.

4. The thin-film transistor array substrate of claim 1, wherein a portion of the facing electrode formed outside the pixel electrode has a concaved mirror shape.

5. The thin-film transistor array substrate of claim 1, further comprising
- a second insulating layer formed on the first insulating layer and having a first opening that exposes the entire pixel electrode; and
- a third insulating layer formed on the second insulating layer and having a second opening greater than the first opening.

6. The thin-film transistor array substrate of claim 5, wherein the third insulating layer covers a portion of the pixel electrode that is electrically connected to one of source and drain electrodes.

7. The thin-film transistor array substrate of claim 5, wherein the buffer layer, the first insulating layer, and the second insulating layer form substantially the same etch surface.

8. An organic light-emitting display comprising:
- a buffer layer formed on a substrate;
- a thin-film transistor comprising an active layer, a gate electrode, a source electrode, and a drain electrode formed on the buffer layer;
- an organic light-emitting device comprising i) a pixel electrode disposed on the same layer as the gate electrode, ii) an intermediate layer that comprises a light-emitting layer and covers on an upper side and outer side-surfaces of the pixel electrode, and iii) a facing electrode that covers the intermediate layer and is formed in a first gap formed at peripherals of the pixel electrode;
- a first insulating layer formed on the buffer layer and a lower side of the pixel electrode, and disposed between the active layer and the gate electrode;
- a second insulating layer disposed between the first insulating layer and the source and drain electrodes and having a first opening that exposes the pixel electrode; and
- a third insulating layer formed on the second insulating layer and having a second opening greater than the first opening,
wherein the buffer layer, the first insulating layer, and the second insulating layer form substantially the same etch surface, and wherein the first gap is formed between the etch surface and the outer side-surfaces of the pixel electrode.

9. The organic light-emitting display of claim 8, wherein a portion of the facing electrode formed outside the pixel electrode has a diaphragm shape.

10. The organic light-emitting display of claim 8, wherein a portion of the facing electrode formed outside the pixel electrode has a concaved mirror shape.

11. The organic light-emitting display of claim 8, further comprising a capacitor that includes a lower electrode disposed as the same layer of the active layer and an upper electrode disposed as the same layer of the gate electrode, wherein the second insulating layer has a third opening through which the upper electrode is exposed, and wherein a second gap is formed between the third opening and the outer side-surfaces of the upper electrode.

* * * * *